(12) United States Patent
Su et al.

(10) Patent No.: US 11,577,406 B2
(45) Date of Patent: Feb. 14, 2023

(54) VACUUM SUCKER AND SUCTION DEVICE COMPRISING THE SAME

(71) Applicant: SYNCMOLD ENTERPRISE CORP., New Taipei (TW)

(72) Inventors: Yen-Chang Su, New Taipei (TW); Chien-Cheng Yeh, New Taipei (TW); Ching-Hui Yen, New Taipei (TW)

(73) Assignee: SYNCMOLD ENTERPRISE CORP., New Taipei (TW)

( * ) Notice: Subject to any disclaimer, the term of this patent is extended or adjusted under 35 U.S.C. 154(b) by 414 days.

(21) Appl. No.: 16/864,542

(22) Filed: May 1, 2020

(65) Prior Publication Data

US 2020/0346354 A1  Nov. 5, 2020

Related U.S. Application Data

(60) Provisional application No. 62/842,054, filed on May 2, 2019.

(51) Int. Cl.
| | |
|---|---|
| *B25J 15/06* | (2006.01) |
| *F16B 2/04* | (2006.01) |
| *F16M 11/24* | (2006.01) |
| *F16B 9/02* | (2006.01) |
| *F16M 13/02* | (2006.01) |
| *G06F 1/16* | (2006.01) |
| *H05K 5/02* | (2006.01) |

(52) U.S. Cl.
CPC .............. *B25J 15/0625* (2013.01); *F16B 2/04* (2013.01); *F16B 9/02* (2013.01); *F16M 11/24* (2013.01); *F16M 13/02* (2013.01); *G06F 1/1601* (2013.01); *H05K 5/0234* (2013.01); *F16M 2200/08* (2013.01)

(58) Field of Classification Search
CPC ... B25J 15/0625; B25J 15/065; B65G 47/917; B65G 47/918; B66C 1/0243; B66C 1/0256; Y10S 901/40
USPC .................................................. 294/186, 187
See application file for complete search history.

(56) References Cited

U.S. PATENT DOCUMENTS

| | | | | |
|---|---|---|---|---|
| 4,593,947 | A * | 6/1986 | Yocum ................... | B65G 47/91 294/187 |
| 6,457,759 | B1 * | 10/2002 | Unokuchi ............. | B25B 11/007 294/186 |
| 6,502,808 | B1 * | 1/2003 | Stone .................... | B25B 11/005 269/21 |
| 7,000,964 | B1 * | 2/2006 | Porras ................... | B65G 47/917 294/186 |

(Continued)

*Primary Examiner* — Dean J Kramer
(74) *Attorney, Agent, or Firm* — Muncy, Geissler, Olds & Lowe, P.C.

(57) ABSTRACT

A vacuum sucker is installed on a robotic arm to suck an object. The robotic arm includes a body and a tip axis. The tip axis is disposed with an adapter plate. The vacuum sucker includes a housing, an actuator, and a flexible suction cup. The actuator passes through the housing and includes a main part, a thrust rod, and an elastic element. The main part has a first end and a hollow slot. The flexible suction cup is sleeved on the first end and is formed with an air chamber. When the thrust rod is located at the first position, the air chamber and the hollow slot are not intercommunicated with each other. When the thrust rod is driven by the adapter plate to move to a second position, the air chamber and the hollow slot are intercommunicated with each other.

15 Claims, 10 Drawing Sheets

(56) References Cited

U.S. PATENT DOCUMENTS

| | | | |
|---|---|---|---|
| 8,371,631 B2 * | 2/2013 | Lin | B25J 15/0061 |
| | | | 294/186 |
| 8,690,214 B2 * | 4/2014 | Lindsey, Jr. | H05K 13/0409 |
| | | | 294/185 |
| 9,669,554 B2 * | 6/2017 | Eisele | F16K 1/126 |

* cited by examiner

VACUUM SUCKER AND SUCTION DEVICE COMPRISING THE SAME

CROSS REFERENCE TO RELATED APPLICATION

This application claims the benefit of U.S. Provisional Application Ser. No. 62/842,054 filed on May 2, 2019. The entirety of the Application is incorporated herein by reference.

BACKGROUND OF THE INVENTION

1. Field of the Invention

The present invention relates to a vacuum sucker and a suction device comprising the same, more particularly, the present invention relates to a vacuum sucker and a suction device that are installed on a robotic arm to suck an object.

2. Description of Related Art

A vacuum sucker installed on the conventional robotic arm is usually externally connected, and the suction of the vacuum sucker toward an object is not driven by the robotic arm. In detail, the conventional vacuum suckers, such as electric vacuum suckers and pneumatic vacuum suckers, need extra power sources to be driven to change the air pressure of the air chamber in the suction cup of the vacuum sucker. The electric vacuum suckers would be externally connected to a motor, and the pneumatic vacuum sucker would be externally connected to a gas pipe or an air bottle. The robotic arm is mainly used to control and adjust the position of the vacuum sucker.

In addition to the external power sources of the vacuum suckers, an independent signal source is also provided to control the vacuum sucker to operate. However, the structure and the circuit arrangement of the robotic arm would be too complicated after the equipment which provides the external power sources and the signal source is installed on the robotic arm. The circuit arrangement would be a concern, and there are many limitations in practice.

SUMMARY OF THE INVENTION

A principal object of the present invention is to provide a vacuum sucker that uses a robotic arm as the power source. The tip axis of the robotic arm is directly used as the power source. Only one adapter plate easily installed on the robotic arm is required. The rotation of the adapter plate can be used to control the vacuum sucker to suck or release the object. The vacuum sucker can operate without connecting to other pipes or circuits of other extra power sources. The process of installing the vacuum sucker on the robotic arm is simplified. In addition to the robotic arm, other signal sources are not required during operation. The vacuum sucker may suck or release the object merely by controlling the robotic arm.

To achieve the above objective, the present invention provides a vacuum sucker, which is installed on a robotic arm for sucking an object. The robotic arm comprises a body and a tip axis, the tip axis includes a flange face, wherein an adapter plate is secured on the flange face, and the object comprises a suction surface. The vacuum sucker comprises a housing, an actuator, and a flexible suction cup. The housing is fixed on the body. The actuator passes through the housing and includes a main part, a thrust rod, and an elastic element. The main part has a first end, a second end opposite to the first end, and a hollow slot being intercommunicated with the first end and the second end. The thrust rod has a head portion and a rod body. The rod body passes through the hollow slot of the main part and protrudes from the second end. The head portion detachably thrusts the first end. The elastic element abuts between the main part and the thrust rod. The elastic element is disposed in the hollow slot and sleeved on the rod body. The elastic element provides an elastic force to the thrust rod and makes the head portion tend to thrust the first end and the thrust rod tends to a first position. The flexible suction cup is sleeved on the first end of the main part. The flexible suction cup is formed with an air chamber and detachably thrusts the suction surface. When the thrust rod is located at the first position, the first end is closed and the air chamber and the hollow slot are not intercommunicated with each other. When the thrust rod is driven by the adapter plate to move to a second position, the head portion moves away from the first end and the air chamber and the hollow slot are intercommunicated with each other.

When the flexible suction cup thrusts the suction surface of the object and the air chamber is in a low vacuum state, the object is sucked on the flexible suction cup.

When the vacuum sucker is in an initial state, the thrust rod is located at the first position and the air chamber of the flexible suction cup defines a first volume.

When the thrust rod is located at the second position, the flexible suction cup thrusts the suction surface of the object and is compressed. The vacuum sucker is in a compressed state. The air chamber of the flexible suction cup defines a second volume, and the second volume is smaller than the first volume.

When the vacuum sucker is in the compressed state, by switching the thrust rod from the second position to the first position and by stretching the flexible suction cup, the vacuum sucker is switched into a suction state. Meanwhile the air chamber is in the low vacuum state. The air chamber of the flexible suction cup defines a third volume. The third volume is larger than the second volume and smaller than or equal to the first volume.

The flexible suction cup further comprises a flexible hose and a suction portion. The flexible hose is connected to a second connection section. The suction portion and the flexible hose are flexible.

The flexible vacuum cup further comprises a wavy structure. When the vacuum sucker is in the compressed state, the wavy structure is folded. When the vacuum sucker is in the suction state, the wavy structure is stretched.

The main part comprises a first connection section. The flexible suction cup has a second connection section. The second connection section is tightly sleeved on the first connection section.

The main part further comprises a large-diameter section. The large-diameter section connects to the first connection section. The second connection section thrusts the large-diameter section.

The main part further includes a small-diameter section. The small-diameter section connects to the large-diameter section and is inserted in the housing. The hollow slot further has a receiving section. The receiving section is formed in the small-diameter section and is adapted to receive the elastic element.

The actuator further includes a positioning element being sleeved on the small-diameter section. The positioning element and the large-diameter section clip the housing, and the actuator is secured on the housing.

The thrust rod has a circlip clipping on the rod body, and the elastic element thrusts between the large-diameter section and the circlip.

The hollow slot has a circulation section. The head portion further has a seal ring being sleeved on the rod body. When the thrust rod is located at the first position, the seal ring abuts the first end and closes the circulation section. The air chamber and the circulation section are not intercommunicated with each other. When the thrust rod is located at the second position, the air chamber and the circulation section are intercommunicated with each other.

One side of the adapter plate away from the flange face has at least one protruding portion. The at least one protruding portion has two inclined sections and a flat section. The flat section is located between the inclined sections. The thrust rod further has an end portion opposite to the head portion. When the tip axis rotates so that the at least one protruding portion pushes the end portion of the thrust rod, the thrust rod moves from the first position to the second position. When the tip axis rotates so that the at least one protruding portion leaves the end portion, the thrust rod moves from the second position back to the first position.

The vacuum sucker further comprises at least one securing element. The housing further includes at least one securing hole. The at least one securing element passes through the at least one securing hole to secure the housing to the body of the robotic arm.

The present invention further provides a suction device, which is installed on a robotic arm for sucking an object. The robotic arm comprises a body and a tip axis. The tip axis includes a flange face. The object comprises a suction surface. The suction device comprises an adapter plate and a vacuum sucker. The adapter plate is secured on the flange face. The vacuum sucker includes a housing, an actuator, and a flexible suction cup. The housing is fixed on the body. The actuator passes through the housing. The actuator has a main part, a thrust rod, and an elastic element. The main part has a first end, a second end opposite to the first end, and a hollow slot being intercommunicated with the first end and the second end. The thrust rod has a head portion and a rod body. The rod body passes through the hollow slot of the main part and protrudes from the second end. The head portion detachably thrusts the first end. The elastic element abuts between the main part and the thrust rod and is disposed in the hollow slot. The elastic element is sleeved on the rod body. The elastic element provides an elastic force to the thrust rod and make the head portion tend to thrust the first end and the thrust rod tends to a first position. The flexible suction cup is sleeved on the first end of the main part. The flexible suction cup is formed with an air chamber and detachably thrusts the suction surface. When the thrust rod is located at the first position, the first end is closed and the air chamber and the hollow slot are not intercommunicated with each other. When the thrust rod is driven by the adapter plate to move to a second position, the head portion moves away from the first end and the air chamber and the hollow slot are intercommunicated with each other.

When the flexible suction cup thrusts the suction surface of the object and the air chamber is in a low vacuum state, the object is sucked on the flexible suction cup.

When the vacuum sucker is in an initial state, the thrust rod is located at the first position and the air chamber of the flexible suction cup defines a first volume. When the thrust rod is located at the second position, the flexible suction cup thrusts the suction surface of the object and is compressed, the vacuum sucker is in a compressed state, the air chamber of the flexible suction cup defines a second volume. The second volume is smaller than the first volume.

When the vacuum sucker is in the compressed state, by switching the thrust rod from the second position to the first position and by stretching the flexible suction cup, the vacuum sucker is switched into a suction state. Meanwhile the air chamber is in the low vacuum state. The air chamber of the flexible suction cup defines a third volume. The third volume is larger than the second volume and smaller than or equal to the first volume.

One side of the adapter plate away from the flange face has at least one protruding portion. The at least one protruding portion has two inclined sections and a flat section. The flat section is located between the inclined sections. The thrust rod further has an end portion opposite to the head portion. When the tip axis rotates so that the at least one protruding portion pushes the end portion of the thrust rod, the thrust rod moves from the first position to the second position. When the tip axis rotates so that the at least one protruding portion leaves the end portion, the thrust rod moves from the second position back to the first position.

DETAILED DESCRIPTION OF THE PREFERRED EMBODIMENT

Figure 1:
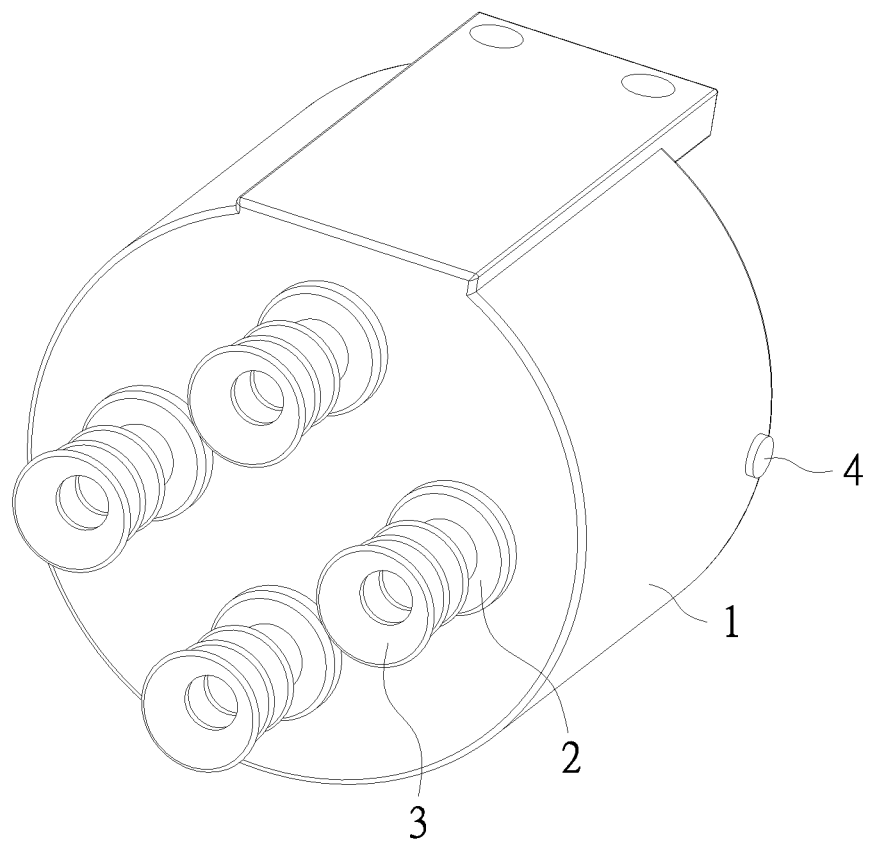
FIG. 1 is a perspective view showing the vacuum sucker of an embodiment of the present invention.
Figure 2:
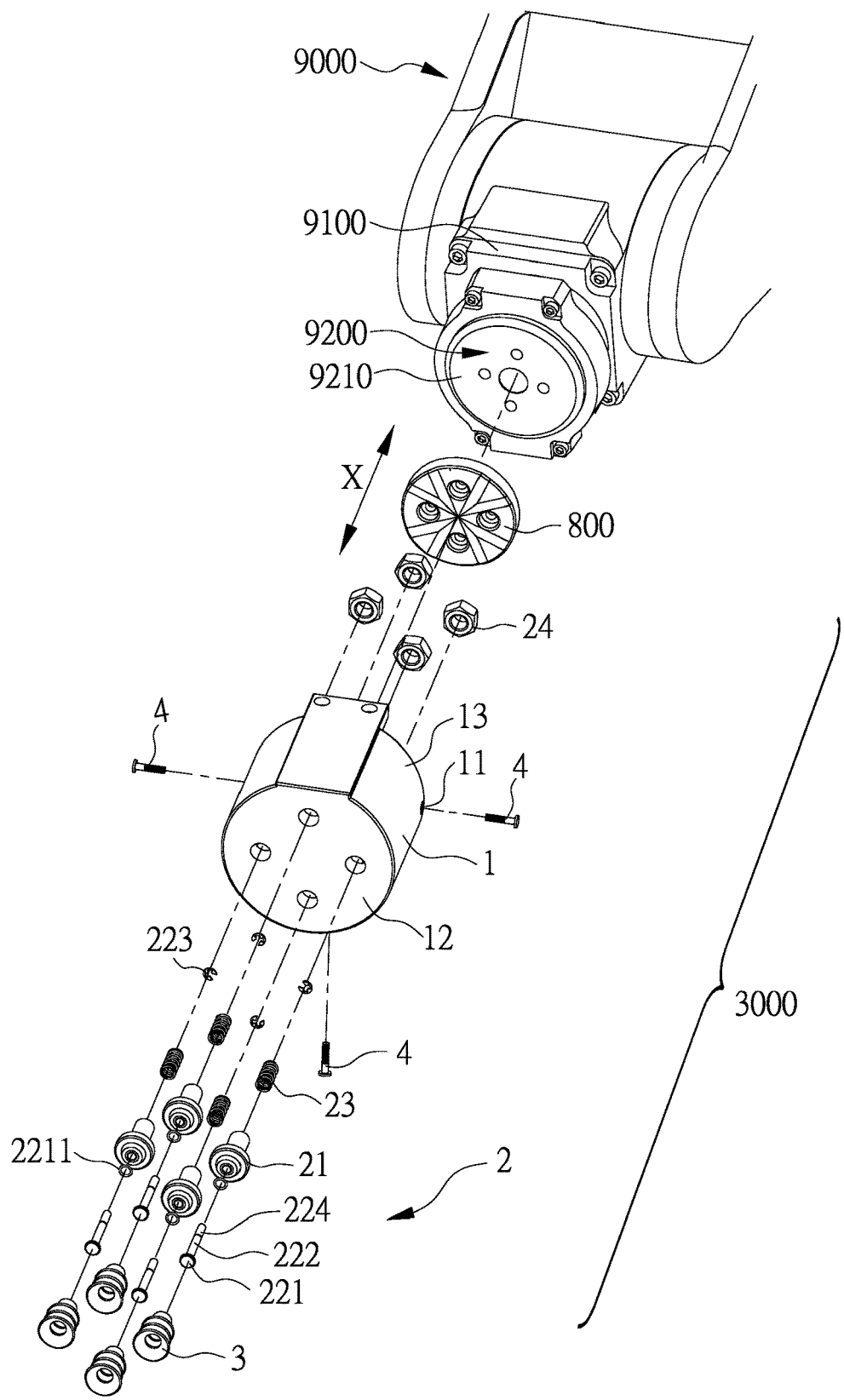
FIG. 2 is an exploded perspective view showing the vacuum sucker of an embodiment of the present invention.
Figure 3:
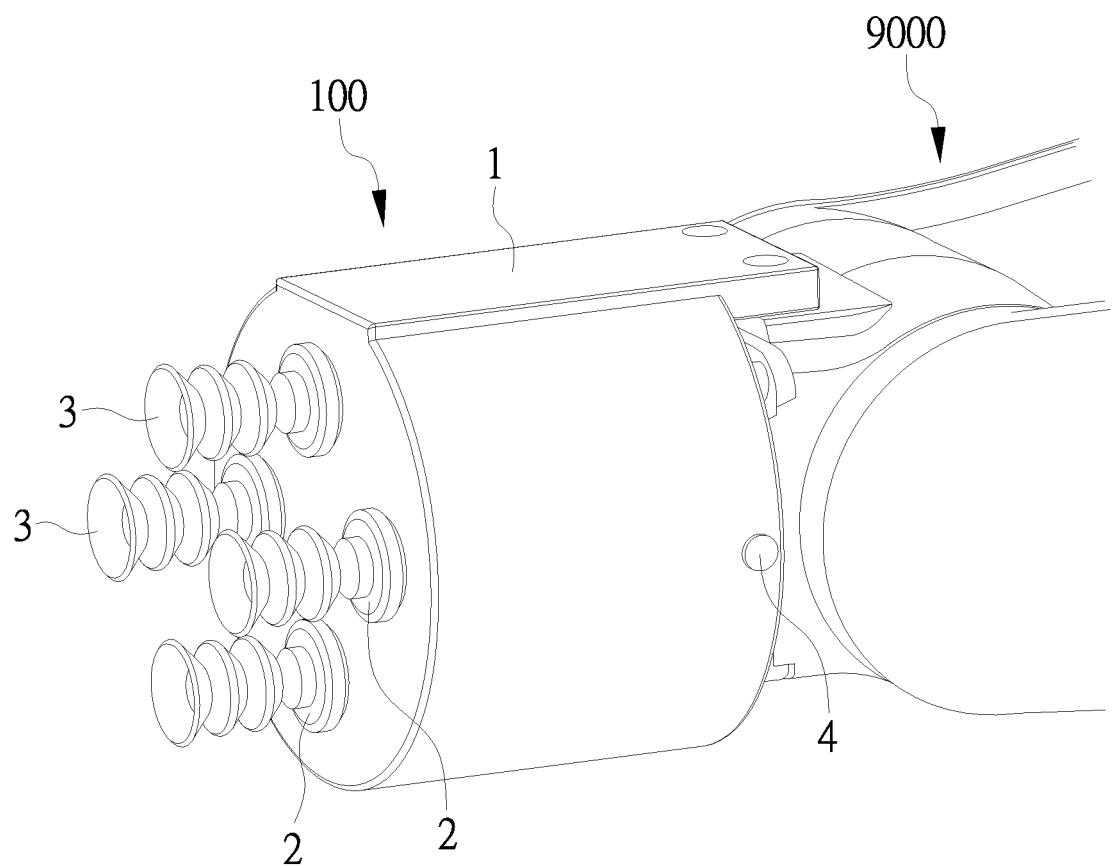
FIG. 3 is a perspective view showing the vacuum sucker of an embodiment of the present invention connecting to the robotic arm.
Figure 9:
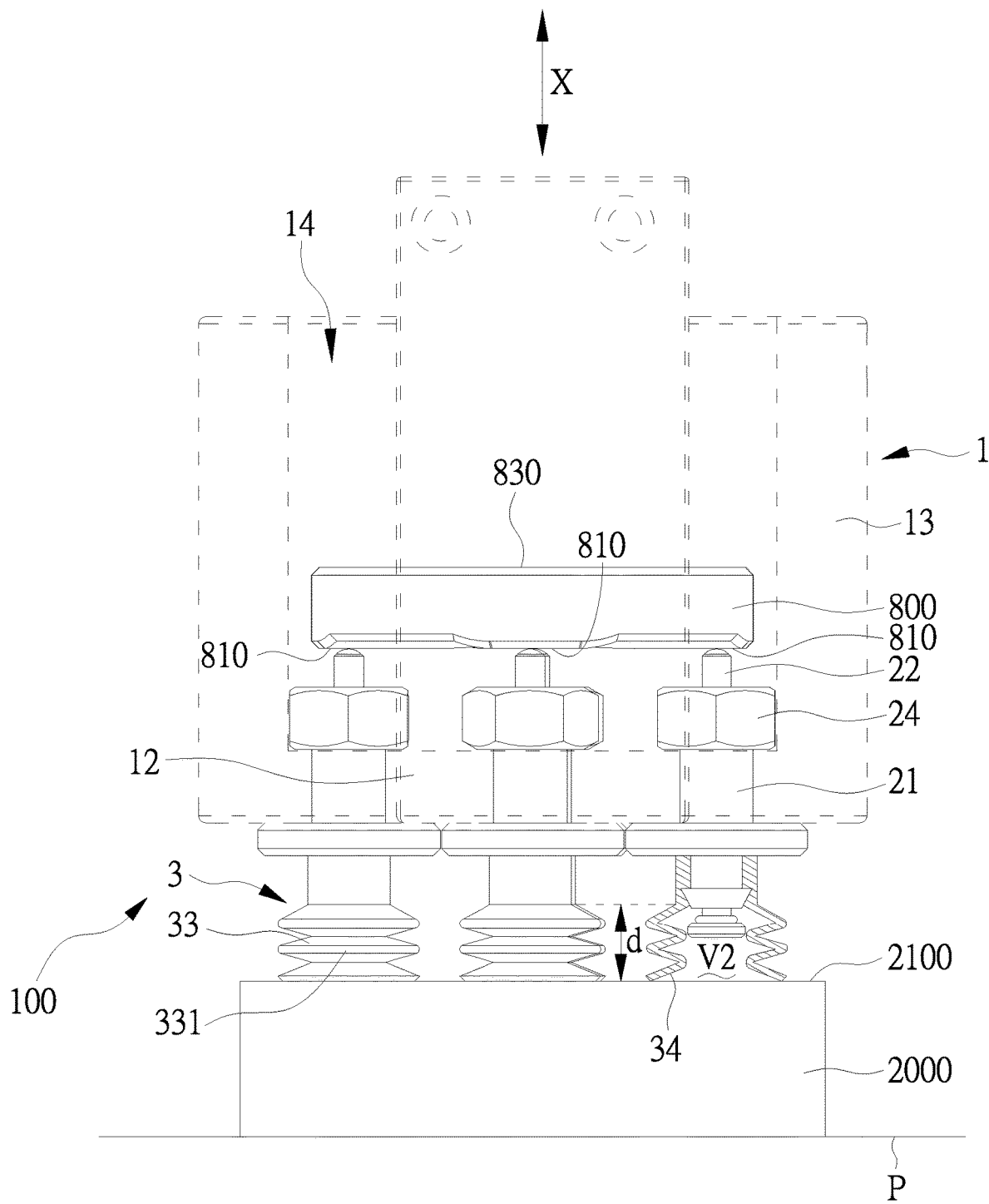
FIG. 9 is a side view showing the vacuum sucker of the present invention in the compressed state.
Figure 10:
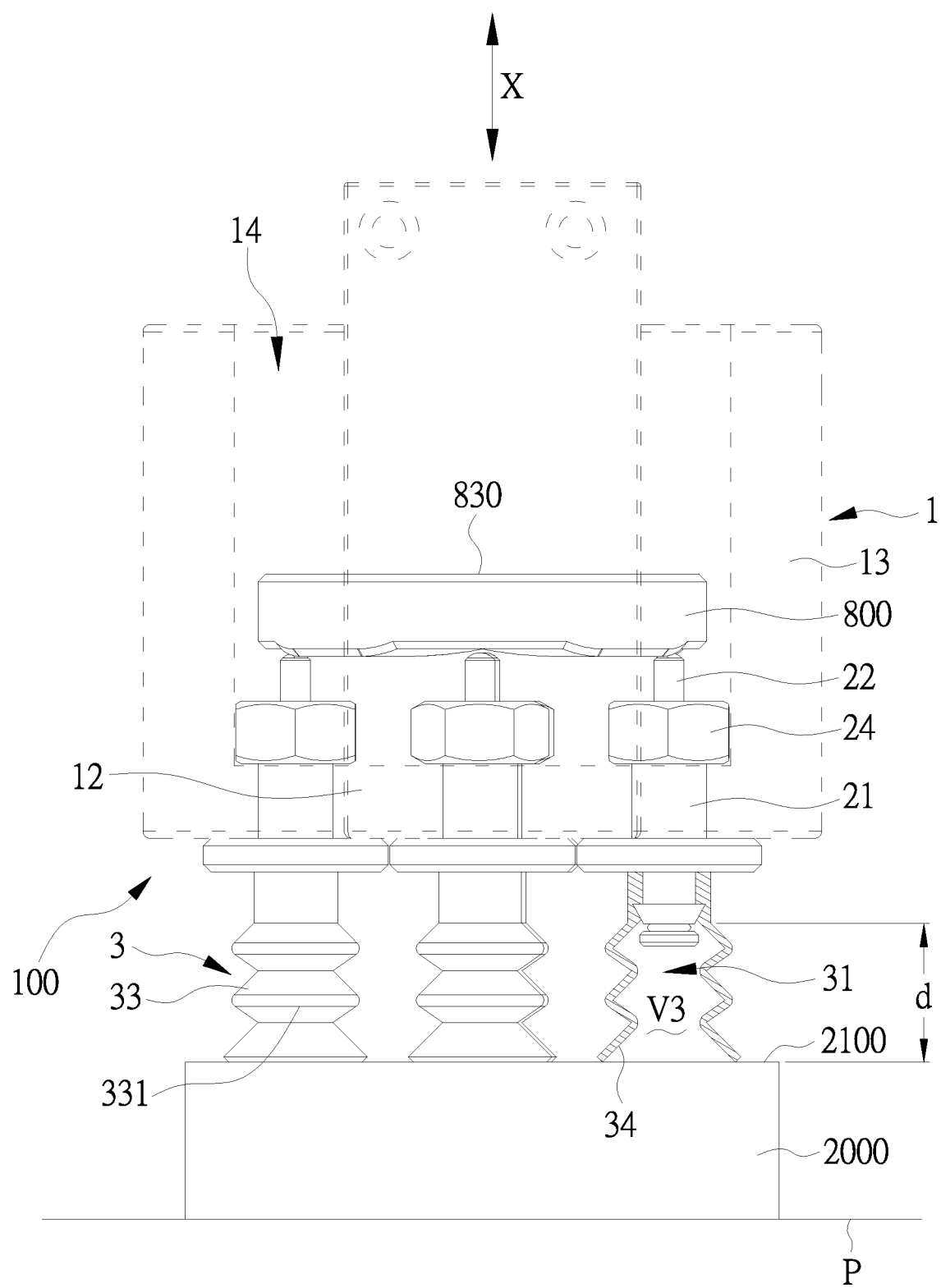
FIG. 10 is a side view showing the vacuum sucker of the present invention in the suction state.

The vacuum sucker 100 of the present invention is shown in FIG. 1, FIG. 2, and FIG. 3. The vacuum sucker 100 is installed on a robotic arm 9000 and is driven by an adapter plate 800 to suck an object 2000 as shown in FIG. 9 and FIG. 10. The robotic arm 9000 comprises a body 9100 and a tip axis 9200. The tip axis 9200 includes a flange face 9210. The adapter plate 800 is secured on the flange face 9210. The flange face 9210 defines an axial line X perpendicular thereto. The vacuum sucker 100 is installed on the robotic arm 9000 along the axial line X. The vacuum sucker 100 comprises a housing 1, four actuators 2, four flexible suction cups 3, and three securing elements 4. The amounts of the actuators 2, the flexible suction cups 3, and the securing elements 4 are for illustration but are not limited thereto.

Figure 8:
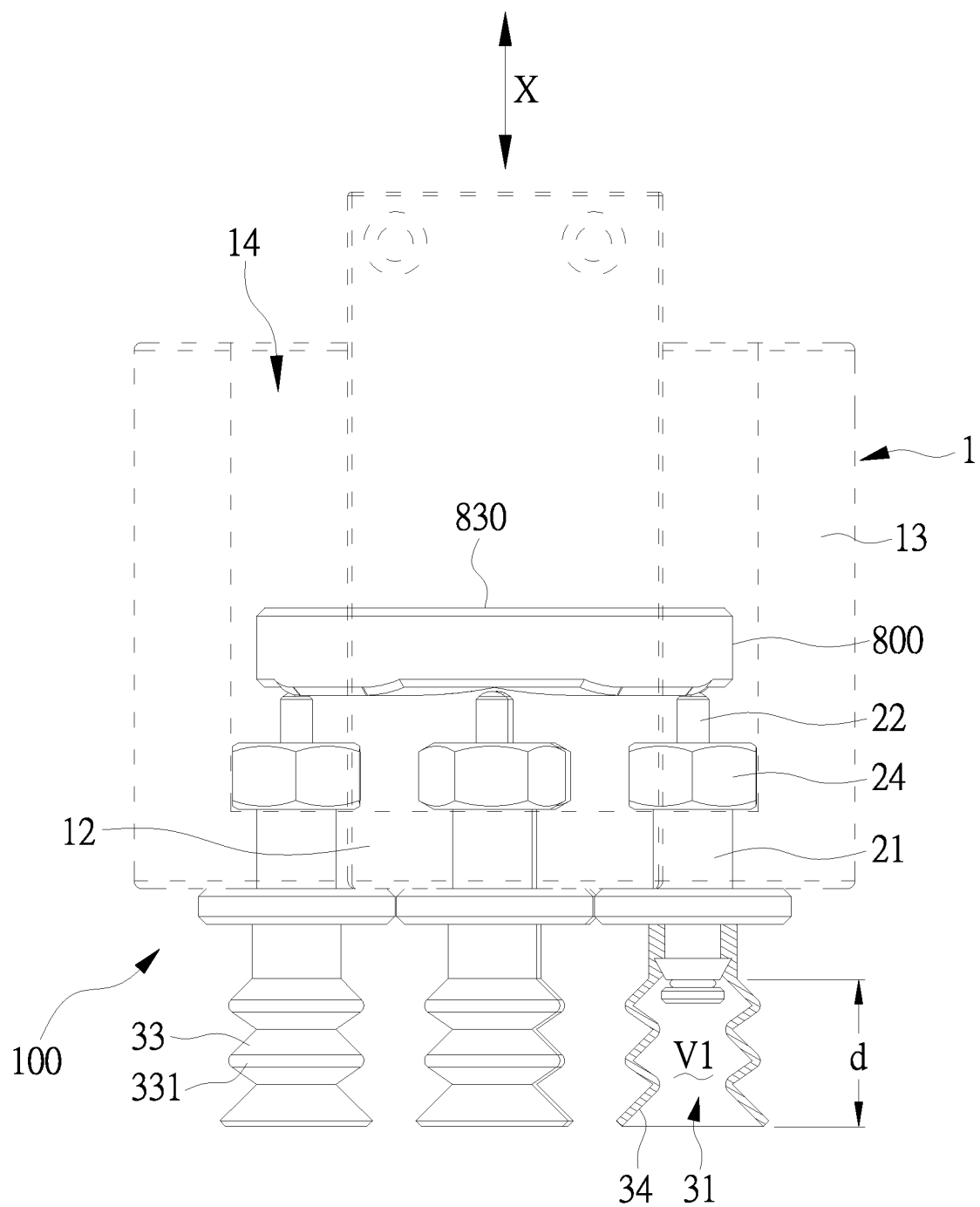
FIG. 8 is a side view showing the vacuum sucker of the present invention in the initial state.

Please also refer to FIG. 8, the housing 1 is hollow and cylindrical and has three securing holes 11, a bottom wall 12, a surrounding wall 13, and a receiving space 14. The bottom wall 12 is connected to the surrounding wall 13. The bottom wall 12 and the surrounding wall 13 integrally define the receiving space 14. The securing holes 11 are formed on the surrounding wall 13. The securing elements 4 pass through the securing holes 11 respectively to secure the housing 1 to the body 9100 of the robotic arm 9000. The figure of the present embodiment shows three securing holes 11 for illustration. However, the amount of the securing holes 11 is not limited thereto, as long as the amount of the securing holes 11 matches with the amount of the securing elements 4.

As shown in FIG. 2, FIG. 4, FIG. 5, and FIG. 6, each of the actuators 2 passes through the housing 1 and is respectively connected to each of the flexible suction cups 3. Each of the actuators 2 comprises a main part 21, a thrust rod 22, an elastic element 23, and a positioning element 24. Wherein, the thrust rod 22 movably passes through the main part 21. The elastic element 23 abuts between the main part 21 and the thrust rod 23. The positioning element 24 is sleeved on the main part 21.

The main part 21 has a first end 211, a second end 212 opposite to the first end 211, a hollow slot 213 being intercommunicated with the first end 211 and the second end 212, a first connection section 215, a large-diameter section 216, and a small-diameter section 217. The hollow slow 213 has a circulation section 2131 and a receiving section 2132. The receiving section 2132 is formed in the small-diameter section 217 and is adapted to receive the elastic element 23. The first connection section 215 has a first hook 2151. The large-diameter section 216 abuts against the outer surface of the bottom wall 12. The small-diameter section 217 passes through the bottom wall 12 and is partially received in the receiving space 14.

The thrust rod 22 has a head portion 221, a rod body 222, a circlip 223, and an end portion 224. The rod body 222 passes through the hollow slot 213 of the main part 21 and protrudes from the second end 212. The head portion 221 is disposed on one end of the rod body 222 that is adjacent to the first end 211. The head portion 221 detachably thrusts the first end 211. The end portion 224 is disposed on the other end of the rod body 222 that is opposite to the head portion 221. The circlip 223 clips on the rod body 222 for the elastic element 23 to abut. In the present embodiment, the head portion 221 has a seal ring 2211 being sleeved on the rod body 222. The seal ring 2211 is an O-ring and is preferably made of rubber. The seal ring 2211 may move away from or close to the first end 211 along the axial line X to open or close the circulation section 2131.

Figure 4:
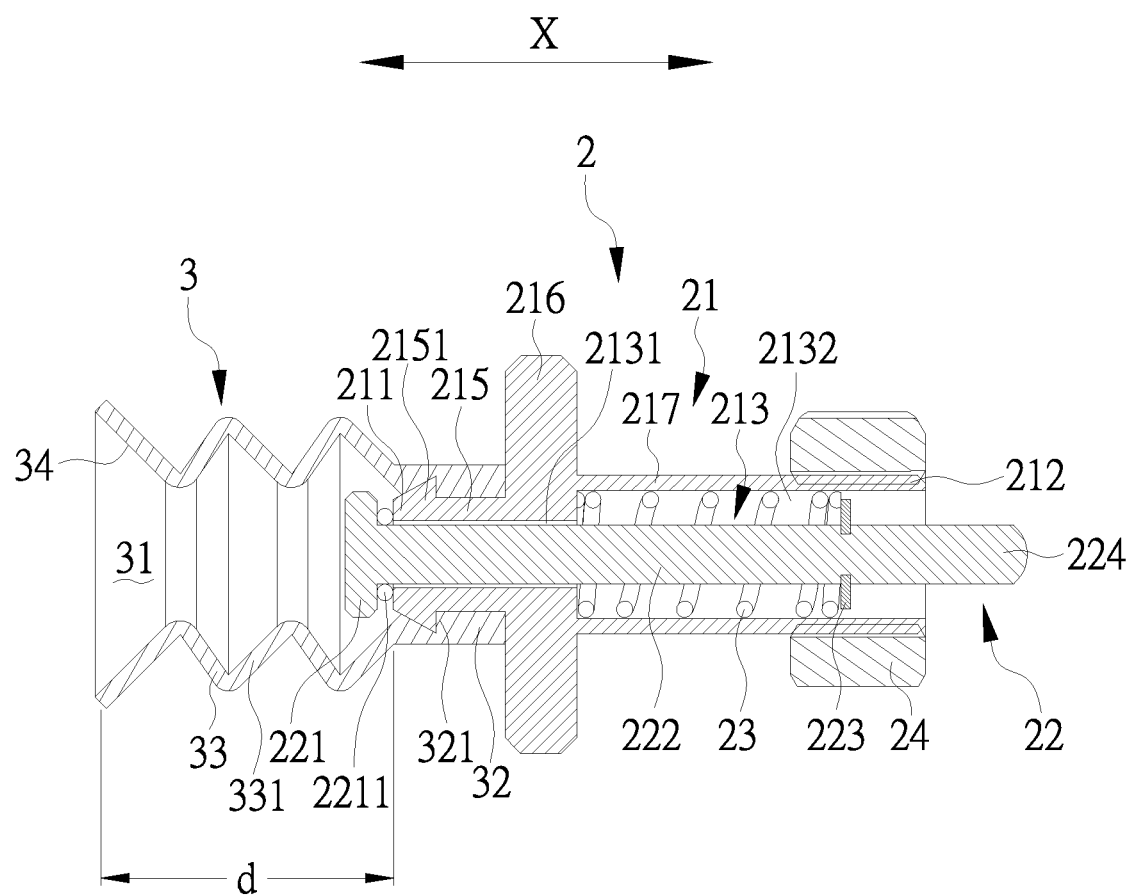
FIG. 4 is a partial cross-sectional view showing the thrust rod of an embodiment of the present invention located at the first position.
Figure 5:
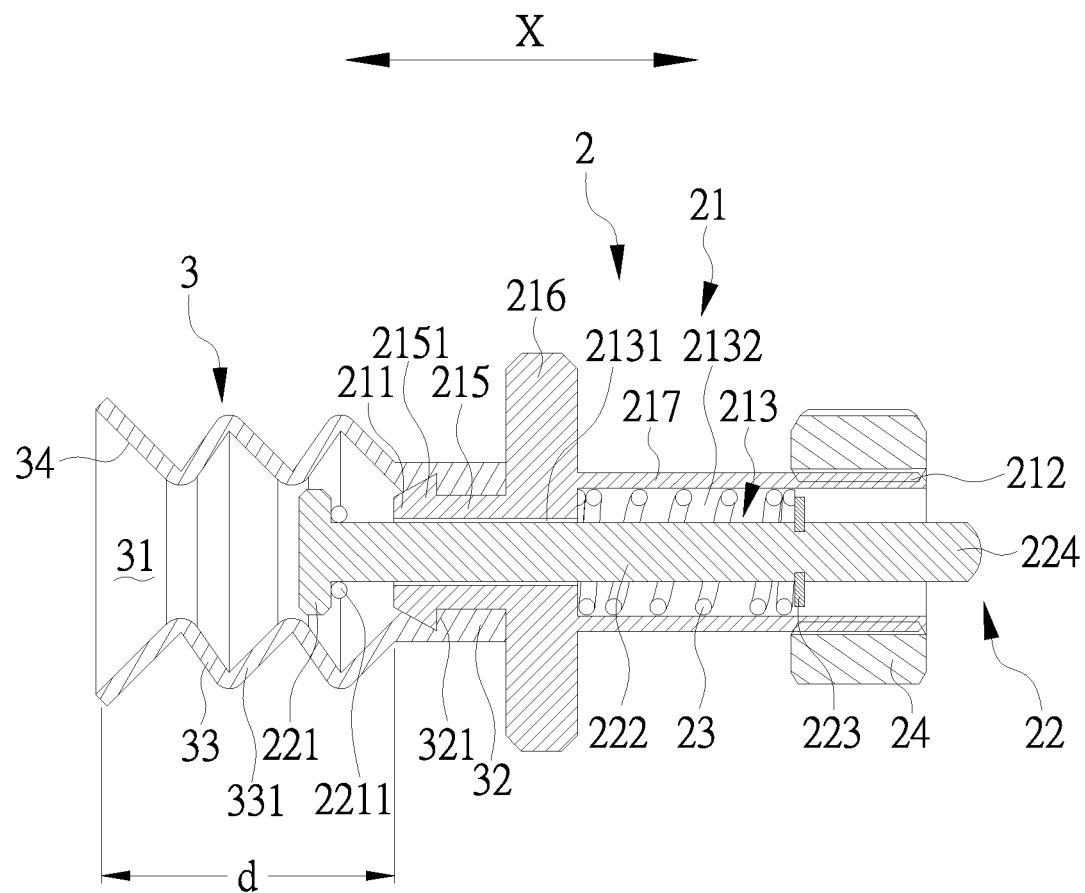
FIG. 5 is a partial cross-sectional view showing the thrust rod of an embodiment of the present invention located at the second position.
Figure 6:
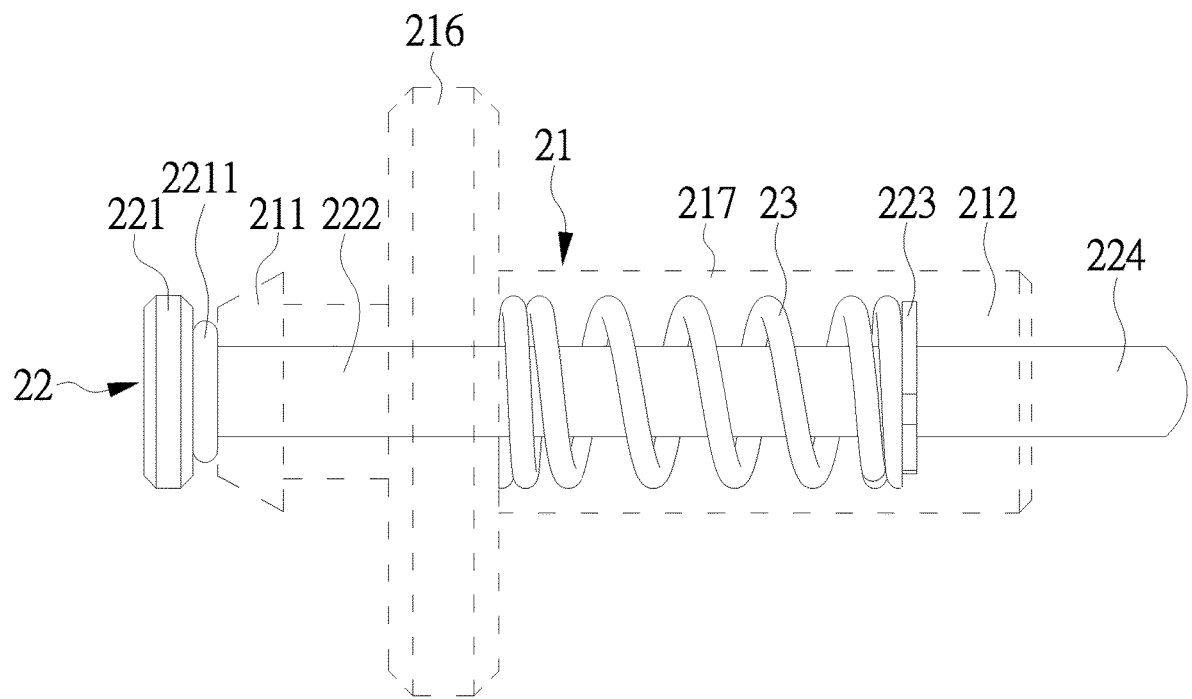
FIG. 6 is a partial side view showing the vacuum sucker of an embodiment of the present invention.

The elastic element 23 is disposed in the receiving section 2132 of the hollow slot 213 and sleeved on the rod body 222. The elastic element 23 thrusts between the large-diameter section 216 and the circlip 223. Therefore, the elastic element 23 provides an elastic force to the thrust rod 22 and make the thrust rod 22 tend to a first position as shown in FIG. 4. In other words, the head portion 221 of the thrust rod 22 thrusts the first end 211 of the main part 21. When the end portion 224 of the thrust rod 22 is pushed by the adapter plate 800, the head portion 221 moves away from the first end 211 along the axial line X. When the thrust rod 22 moves to a second position as shown in FIG. 5, the head portion 221 detaches from the first end 211.

The positioning element 24 is sleeved on the small-diameter section 217 of the main part 21 close to the second end 212 and is located at the receiving space 14 of the housing 1. The positioning element 24 and the large-diameter section 216 clip the bottom wall 12 of the housing 1. Therefore, the main part 21 is secured to the housing 1. In the present embodiment, the small-diameter section 217 is outer threaded. The positioning element 24 is a nut and is inner threaded to match with the small-diameter section 217. The positioning element 24 is screwed on the small-diameter section 217.

The flexible suction cups 3 are specified as follows and in FIG. 4. Each of the flexible suction cups 3 detachably thrusts the object 2000 and is sleeved on the first end 211 of the main part 21. Each of the flexible suction cups 3 is formed with an air chamber 31 and has a second connection section 32, a flexible hose 33, and a suction portion 34, which are integrated. Wherein, the second connection section 32 has a second hook 321 for hooking the first hook 2151 of the first connection section 215. In the present embodiment, the flexible hose 33 has a retractable wavy structure 331 and is defined with a length d along the axial line X.

It should be noted that the second connection section 32, the flexible hose 33 and the suction portion 34 are integrated and made of a flexible material. As shown in the drawings, the second connection section 32 is tightly sleeved on the first connection section 215. There's no gap between the first connection section 215 and the second connection section 32 for air to flow. The first hook 2151 of the first connection section 215 and the second hook 321 of the second connection section 32 are hooked to each other. The second connection section 32 thrusts the large-diameter section 216. When each of the flexible suction cups 3 is stretched, the main part 21 and the flexible suction cup 3 would not be detached. When each of the flexible suction cups 3 is compressed, the second connection section 32 would be blocked by the large-diameter section 216 and would not move relative to the main part 21.

Figure 7:
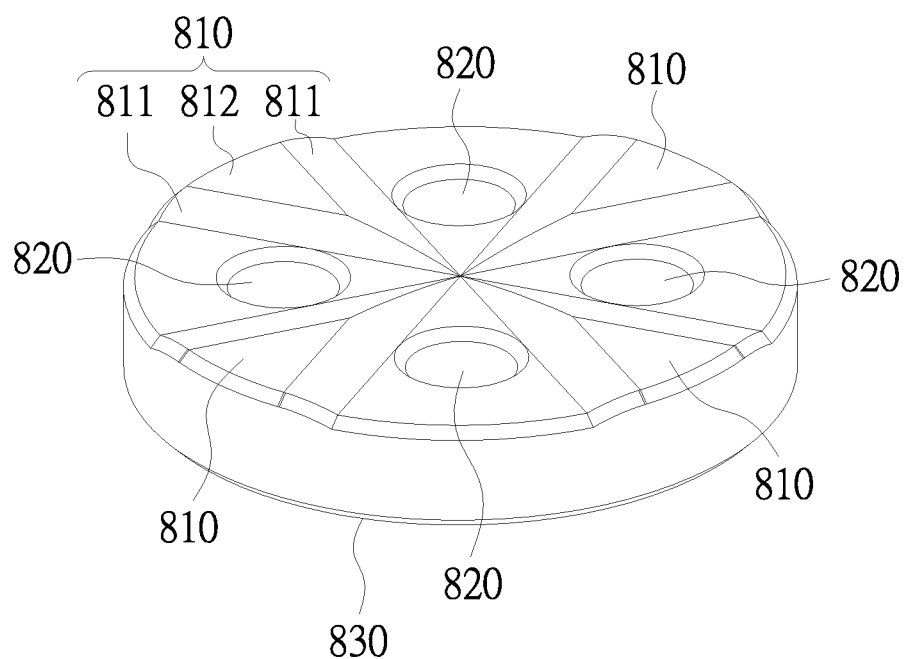
FIG. 7 is a perspective view showing the adapter plate installed on the robotic arm of an embodiment of the present invention.

Please refer to FIG. 2 and FIG. 7, the adapter plate 800 is secured on the tip axis 9200 of the robotic arm 9000. The adapter plate 800 has four protruding portions 810, four positioning holes 820, and a connecting plane 830. The protruding portions 810 are located on one side, which is the opposite side of the connecting plane 830, away from the flange face 9210 and are adapted for pushing the end portion 224 of the thrust rod 22. Each of the protruding portions 810 roughly has a sector cross-section and has two inclined sections 811 and a flat section 812, and the flat section 812 is located between the inclined sections 811. It should be noted that the drawings of the present embodiment illustrate four protruding portions 810, but the amount of the protruding portions 810 is not limited as long as the amounts of the actuators 2, the flexible suction cups 3, and the protruding portions 810 match with one another. The adapter plate 800 is secured to the tip axis 9200 by screws (not shown) which pass through the positioning holes 820 and then are screwed on the tip axis 9200 of the robotic arm 9000. The connecting plane 830 contacts with the flange face 9210 of the tip axis 9200.

Due to the operation of the thrust rods 22 are the same, therefore, the operation of one of the thrust rods 22 of the vacuum sucker 100 is described as follows.

Please refer to FIG. 4 and FIG. 8, the thrust rod 22 is normally located at the first position. When the tip axis 9200 drives the adapter plate 800 to rotate a specific angle, the thrust rod 22 is changed to abut the flat section 812 from the inclined section 811 as shown in FIG. 5 and FIG. 9. In other words, the protruding portion 810 pushes the end portion 224 of the thrust rod 22, and the thrust rod 22 moves from the first position to the second position. When the tip axis 9200 further drives the adapter plate 800 to rotate, the protruding portion 810 detaches from the thrust rod 22. The thrust rod 22 moves from the second position back to the first position.

When the thrust rod 22 is driven by the adapter plate 800 and moves to the second position, the head portion 221 moves away from the first end 211 and the air circulates in the circulation section 2131. The air chamber 31 is intercommunicated with the hollow slot 213. When the thrust rod 22 moves back to the first position, the head portion 221 abuts the first end 211 and closes the circulation section 2131. The air chamber 31 is not intercommunicated with the hollow slot 213.

With the aforementioned operation, the vacuum sucker 100 can be switched among an initial state, a compressed state, and a suction state to suck the object 2000. The relations among the elements during the vacuum sucker 100 of the present invention sucking the object 2000 on a working plane P will be further specified. The description as followings uses one thrust rod 22, one flexible suction cup 3, and one protruding portion 810 for illustration.

Please refer to FIG. 4 and FIG. 8, when the vacuum sucker 100 is in the initial state, the thrust rod 22 is located at the first position. The air does not pass the circulation section 2131, and the air chamber 31 of the flexible suction cup 3 defines a first volume V1.

As mentioned above, when the tip axis 9200 of the robotic arm 9000 rotates, the protruding portion 810 pushes the thrust rod 22 to move the thrust rod 22 to the second position. As illustrated in FIG. 5 and FIG. 9, the air circulates through the circulation section 2131, and further circulates in the hollow slot 213 and the air chamber 31. The body 9100 of the robotic arm 9000 is operated to move at the moment, and the suction portion 34 of the flexible suction cup 3 thrusts a suction surface 2100 of the object 2000. Then, the body 9100 is operated to drive the housing 1 to move toward the working plane P along the axial line X so that the flexible suction cup 3 is pushed and deformed. The wavy structure 331 is gradually folded, and the length d of the flexible hose 33 is shortened. When the flexible suction cup 3 is pushed and deformed and the length d of the flexible hose 33 is compressed to the shortest, the vacuum sucker 100 is in the compressed state as shown in FIG. 9. The air chamber 31 of the flexible suction cup 3 defines a second volume V2. Since the flexible suction cup 3 is compressed and deformed, the second volume V2 is smaller than the first volume V1. Due to the thrust rod 22 is still located at the second position so that the air still circulates in the circulation section 2131. The air pressure in the flexible suction cup 3 and the external air pressure stay the same despite the compressed and deformed flexible suction cup 3.

When the tip axis 9200 rotates to switch the thrust rod 22 from the second position back to the first position, the circulation section 2131 is closed by the seal ring 2211. The air chamber 31 is airtight and has the same air pressure as outside in the beginning. When the body 9100 drives the housing 1 to move away from the suction surface 2100, the flexible suction cup 3 is pulled by the housing 1. Coupled with the weight of the object 2000, the wavy structure 331 of the flexible hose 33 is gradually stretched. The length d of the flexible hose 33 is elongated. When the flexible suction cup 3 is stretched to the limit, the vacuum sucker 100 is in the suction state as shown in FIG. 10. In the meanwhile, the air chamber 31 of the flexible suction cup 3 defines a third volume V3. The third volume V3 is larger than the second volume V2 and smaller than or equal to the first volume V1. Since the volume of the air chamber 31 is increased in the airtight state, the air chamber 31 is in the low vacuum state. Therefore, the vacuum sucker 100 provides a suction force toward the suction surface 2100 of the object 2000, and the object 2000 can be sucked on the flexible suction cup 3.

The body 9100 of the robotic arm 9000 moves away from the working plane P. The object 2000 is sucked on the suction portion 34 and detaches from the working plane P along with the movement of the body 9100 of the robotic arm 9000. When the tip axis 9200 rotates again so that the protruding portion 810 pushes the thrust rod 22 to the second position, the air chamber 31 is released from the low vacuum state, and the suction force of the vacuum sucker 100 toward the object 2000 is gone. The object 2000 is detached from the suction portion 34 of the flexible suction cup 3 and released.

It should be noted that the object 2000 should have a minimum weight and the suction surface 2100 of the object 2000 should have a minimum strength so that the vacuum sucker 100 can effectively operate. On the premise that the weight of the object 2000 is larger than the minimum weight, the actuators 2 would be able to effectively stretch the flexible suction cups 3 when the body 9100 moves away from the working plane P. The volume of the air chamber 31 is increased from the second volume V2 to the third volume V3. On the premise that the strength of the suction surface 2100 is larger than the minimum strength, the air chamber 31 would not be caved in to reduce the low vacuum effect by the low vacuum state of the air chamber 31. In other words, if the suction surface 2100 is caved in toward the air chamber 31, the volume of the air chamber 31 would not be effectively increased. The inner air pressure of the air chamber 31 would not be decreased to provide a stable low vacuum state.

Moreover, the suction surface 2100 of the object 2000 is flat as shown in FIG. 9 and FIG. 10. However, the wavy structure 331 of the flexible hose 33 improves the curvature compatibility of the flexible suction cup 3 to suck the suction surface 2100. In other words, the more layers that the wavy structure 331 has, the more different curvature suction surface 2100 can be sucked by the vacuum sucker 100.

Another embodiment of the present invention is a suction device 3000, which is installed on a robotic arm 9000, for sucking an object 2000. The robotic arm 9000 also comprises a body 9100 and a tip axis 9200. The tip axis 9200 has a flange face 9210. The suction device 3000 comprises the vacuum sucker 100 and the adapter plate 800 as mentioned in the above embodiment. The adapter plate 800 is secured on the flange face 9210. The housing 1 of the vacuum sucker 100 is fixed on the body 9100. In the present embodiment, the housing 1 covers the adapter plate 800, and the adapter plate 800 is located in the receiving space 14.

In summary, the housing of the vacuum sucker and the adapter plate are respectively secured to the body and the tip axis of the robotic arm in the vacuum sucker and the suction device of the present invention. The operable degrees of freedom of the tip axis of the robotic arm are transformed into the movement of the thrust rod of the vacuum sucker along the axial line to control the air to circulate in the circulation section or to close the circulation section. The robotic arm directly controls the operation, and the arrangement of the extra power sources and signal sources can be omitted. The operation of the robotic arm and the vacuum sucker can be controlled by one controller, and the operation is facilitated.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A vacuum sucker, being installed on a robotic arm for sucking an object, the robotic arm comprising a body and a tip axis, the tip axis including a flange face, wherein an adapter plate is secured on the flange face and the object having a suction surface, the vacuum sucker comprising:
   a housing, being fixed on the body;
   an actuator, passing through the housing and including:
      a main part, having a first end, a second end opposite to the first end, a hollow slot being intercommunicated with the first end and the second end, a large-diameter section, a small-diameter section, and a first connection section, wherein the large-diameter section connects to the first connection section, the small-diameter section connects to the large-diameter section and is inserted in the housing, and the hollow slot has a receiving section being formed in the small-diameter section;
      a thrust rod, having a head portion and a rod body, the rod body passing through the hollow slot of the main part and protruding from the second end, the head portion detachably abutting against the first end; and
      an elastic element, abutting between the main part and the thrust rod, being disposed in the hollow slot, and being sleeved on the rod body, the elastic element providing an elastic force to the thrust rod and making the head portion tend to abut against the first end and the thrust rod tend to a first position; and
   a flexible suction cup, being sleeved on the first end of the main part, and being formed with an air chamber and detachably abutting against the suction surface, wherein the flexible suction cup comprises a second connection section, which is tightly sleeved on the first connection section and abuts against the large-diameter section;
   wherein, when the thrust rod is located at the first position, the first end is closed, and the air chamber and the hollow slot are not intercommunicated with each other, and when the thrust rod is driven by the adapter plate to move to a second position, the head portion moves away from the first end, and the air chamber and the hollow slot are intercommunicated with each other.

2. The vacuum sucker as claimed in claim 1, wherein when the flexible suction cup abuts against the suction surface of the object and the air chamber is in a low vacuum state, the object is sucked on the flexible suction cup.

3. The vacuum sucker as claimed in claim 2, wherein when the vacuum sucker is in an initial state, the thrust rod is located at the first position, and the air chamber of the flexible suction cup defines a first volume.

4. The vacuum sucker as claimed in claim 3, wherein when the thrust rod is located at the second position, the flexible suction cup abuts against the suction surface of the object and is compressed, the vacuum sucker is in a compressed state, the air chamber of the flexible suction cup defines a second volume, and the second volume is smaller than the first volume.

5. The vacuum sucker as claimed in claim 4, wherein when the vacuum sucker is in the compressed state, by switching the thrust rod from the second position to the first position, and by stretching the flexible suction cup, the vacuum sucker is switched into a suction state, and meanwhile the air chamber is in the low vacuum state, wherein the air chamber of the flexible suction cup defines a third volume, the third volume is larger than the second volume and smaller than or equal to the first volume.

6. The vacuum sucker as claimed in claim 5, wherein the flexible suction cup further comprises a wavy structure, when the vacuum sucker is in the compressed state, the wavy structure is folded, and when the vacuum sucker is in the suction state, the wavy structure is stretched.

7. The vacuum sucker as claimed in claim 1, wherein the actuator further includes a positioning element being sleeved on the small-diameter section, and the positioning element and the large-diameter section clip the housing, and the actuator is secured on the housing.

8. The vacuum sucker as claimed in claim 7, wherein the thrust rod has a circlip clipping on the rod body, and the elastic element abuts against the large-diameter section and the circlip therebetween.

9. The vacuum sucker as claimed in claim 8, wherein the hollow slot has a circulation section, the head portion further has a seal ring being sleeved on the rod body, wherein when the thrust rod is located at the first position, the seal ring abuts the first end and closes the circulation section, the air chamber and the circulation section are not intercommunicated with each other, and when the thrust rod is located at the second position, the air chamber and the circulation section are intercommunicated with each other.

10. The vacuum sucker as claimed in claim 1, wherein one side of the adapter plate away from the flange face has at least one protruding portion, the at least one protruding portion has two inclined sections and a flat section, the flat section is located between the inclined sections, the thrust rod further has an end portion opposite to the head portion, wherein when the tip axis rotates so that the at least one protruding portion pushes the end portion of the thrust rod, the thrust rod moves from the first position to the second position, and when the tip axis rotates so that the at least one protruding portion leaves the end portion, the thrust rod moves from the second position back to the first position.

11. The vacuum sucker as claimed in claim 10, further comprising at least one securing element, the housing further including at least one securing hole, and the at least one securing element passing through the at least one securing hole to secure the housing to the body of the robotic arm.

12. A suction device being installed on a robotic arm for sucking an object, the robotic arm comprising a body and a tip axis, the tip axis including a flange face, the object comprising a suction surface, the suction device comprising:
   an adapter plate, being secured on the flange face;
   a vacuum sucker, including:
      a housing, being fixed on the body;
      an actuator, passing through the housing and having:
         a main part, having a first end, a second end opposite to the first end, and a hollow slot being intercommunicated with the first end and the second end;
         a thrust rod, having a head portion and a rod body, the rod body passing through the hollow slot of the main part and protruding from the second end, the head portion detachably abutting against the first end; and
         an elastic element, abutting between the main part and the thrust rod, being disposed in the hollow slot, and being sleeved on the rod body, the elastic element providing an elastic force to the thrust rod and making the head portion tend to abut against the first end and the thrust rod tend to a first position; and a flexible suction cup, being sleeved on the first end of the main part, the flexible suction cup being formed with an air chamber and detachably abutting against the suction surface;

wherein, when the thrust rod is located at the first position, the first end is closed and the air chamber and the hollow slot are not intercommunicated with each other, and when the thrust rod is driven by the adapter plate to move to a second position, the head portion moves away from the first end, and the air chamber and the hollow slot are intercommunicated with each other; and wherein one side of the adapter plate away from the flange face has at least one protruding portion, the at least one protruding portion has two inclined sections and a flat section, the flat section is located between the inclined sections, and the thrust rod further has an end portion opposite to the head portion, wherein when the tip axis rotates so that the at least one protruding portion pushes the end portion of the thrust rod, the thrust rod moves from the first position to the second position, and when the tip axis rotates so that the at least one protruding portion leaves the end portion, the thrust rod moves from the second position back to the first position.

13. The suction device as claimed in claim 12, wherein when the flexible suction cup abuts against the suction surface of the object and the air chamber is in a low vacuum state, the object is sucked on the flexible suction cup.

14. The suction device as claimed in claim 13, wherein when the vacuum sucker is in an initial state, the thrust rod is located at the first position, and the air chamber of the flexible suction cup defines a first volume, and when the thrust rod is located at the second position, the flexible suction cup abuts against the suction surface of the object and is compressed, the vacuum sucker is in a compressed state, the air chamber of the flexible suction cup defines a second volume, and the second volume is smaller than the first volume.

15. The suction device as claimed in claim 14, wherein when the vacuum sucker is in the compressed state, by switching the thrust rod from the second position to the first position, and by stretching the flexible suction cup, the vacuum sucker is switched into a suction state, and meanwhile the air chamber is in the low vacuum state, wherein the air chamber of the flexible suction cup defines a third volume, the third volume is larger than the second volume and smaller than or equal to the first volume.

* * * * *